United States Patent [19]
Tanaka

[11] Patent Number: 5,139,962
[45] Date of Patent: Aug. 18, 1992

[54] MOS FABRICATION METHOD WITH SELF-ALIGNED GATE

[75] Inventor: Hiroyuki Tanaka, Tokyo, Japan

[73] Assignee: Oki Electric Industry Co., Ltd., Tokyo, Japan

[21] Appl. No.: 653,312

[22] Filed: Feb. 11, 1991

[30] Foreign Application Priority Data

Feb. 13, 1990 [JP] Japan .................................. 2-29560

[51] Int. Cl.$^5$ .......................................... H01L 21/265
[52] U.S. Cl. ........................................ 437/41; 437/53; 437/229
[58] Field of Search ................. 437/53, 56, 57, 40, 437/41, 58, 229

[56] References Cited

U.S. PATENT DOCUMENTS

| | | | |
|---|---|---|---|
| 4,738,683 | 4/1988 | Blanchard et al. | 437/53 |
| 4,766,089 | 8/1988 | Davids et al. | 437/53 |
| 4,994,405 | 2/1991 | Jayakar | 437/53 |
| 5,017,515 | 5/1991 | Gill | 437/53 |

FOREIGN PATENT DOCUMENTS

| | | | |
|---|---|---|---|
| 61-586 | 12/1986 | Japan . | |
| 0126672 | 6/1987 | Japan | 435/53 |
| 0244882 | 10/1988 | Japan | 437/53 |
| 0276668 | 11/1989 | Japan | 437/53 |

Primary Examiner—Brian E. Hearn
Assistant Examiner—Tuan Nguyen
Attorney, Agent, or Firm—Wenderoth, Lind & Ponack

[57] ABSTRACT

MOS field-effect transistors connected in series on a semiconductor substrate are created by forming at least two first gate electrodes on the substrate, mutually separated by a certain distance, then depositing a polycrystalline conducting layer. The polycrystalline conducting layer is patterened, preferably using an etchback process, to create a second gate electrode self-aligned between each pair of first gate electrodes. Source and drain diffusion layers are created in the substrate, using the first and second gate electrodes as a mask.

3 Claims, 2 Drawing Sheets

MOS FABRICATION METHOD WITH SELF-ALIGNED GATE

BACKGROUND OF THE INVENTION

This invention relates to a fabrication method for a semiconductor device comprising a plurality of MOS field-effect transistors connected in series. In one aspect of the invention, the device comprises a single channel crossed by plural gate electrodes, alternating between first gate electrodes and second gate electrodes, the first gate electrodes being formed prior to the second gate electrodes in the fabrication process. In another aspect of the invention, the channel is subdivided by source and drain diffusion regions between each pair of gate electrodes.

In prior-art fabrication methods of this type, the first gate electrodes are formed by a first photolithography step and covered with an insulating layer, then the second gate electrodes are formed in the space or spaces between the first gate electrodes by a second photolithography step. To allow a margin for mask alignment error between the two photolithography steps, the second gate electrodes must overlap the first gate electrodes to some extent.

This overlap, however, wastes space and imposes a certain minimum length on the first gate electrodes, which is an impediment to the achievement of high integration densities.

SUMMARY OF THE INVENTION

It is accordingly an object of the present invention to fabricate series-connected MOS transistors without overlap between their gate electrodes.

Another object of the invention is to enable the gate electrode length to be minimized.

A fabrication method for forming MOS field-effect transistors connected in series on a semiconductor substrate comprises steps of:

forming at least two first gate electrodes mutually separated by a certain distance;

covering the substrate and first gate electrodes with a polycrystalline conducting layer; and removing the polycrystalline conducting layer from above the first gate electrodes, thereby leaving a second gate electrode comprising a remaining portion of the polycrystalline conducting layer disposed between each pair of first gate electrodes. This step is preferably performed by an etch-back process, by etching back an overlying resist, for example, or by etching back the polycrystalline conducting layer itself.

After the above steps, remaining portions of the polycrystalline conducting layer not disposed between the first gate electrodes are removed, and source and drain diffusion layers are created in the substrate.

DETAILED DESCRIPTION OF THE INVENTION

Two novel semiconductor fabrication processes embodying the present invention will be described below with reference to the drawings. FIG. 1 illustrates the first novel process; FIG. 2 illustrates the second novel process. These drawings are provided to illustrate the invention but not to restrict its scope, which should be determined solely from the appended claims.

Figure 1A:
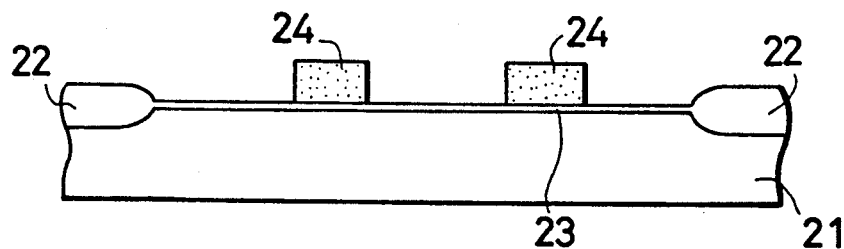
FIGS. 1A to 1D are sectional diagrams illustrating steps in a first novel MOS fabrication process.

With reference to FIG. 1A, the first novel fabrication process begins with the local oxidation of a silicon substrate 21 by well-known methods to create field oxide layers 22. A first gate oxide layer 23 is formed on the exposed surface of the substrate 21 between the field oxide layers 22, then polycrystalline silicon including an impurity such as phosphorus is deposited on the entire surface to a thickness of 0.4 $\mu$m and patterned by well-known photolithographic etching methods to create two first gate electrodes 24 spaced 1.0 $\mu$m apart.

Figure 1B:
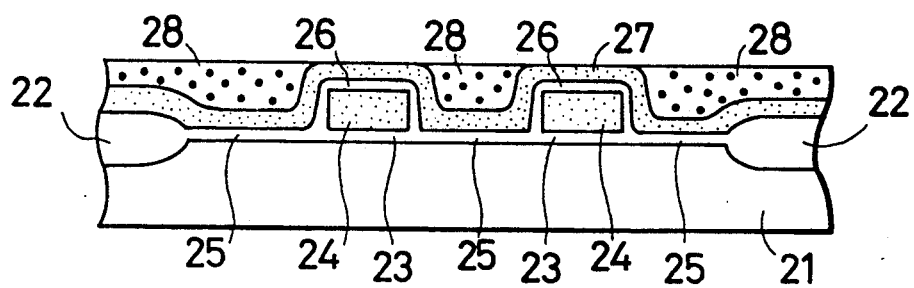

With reference to FIG. 1B, the first gate oxide layer 23 is now removed, except where covered by the first gate electrodes 24, and an oxide layer 25 is formed on the exposed substrate surface by thermal oxidation. The part of the oxide layer 25 disposed between the two first gate electrodes 24 becomes a second gate oxide layer. The upper and side surfaces of the first gate electrodes 24 are simultaneously oxidized, forming oxide layers 26.

Next, a polycrystalline layer 27 including an impurity such as phosphorus is deposited over the entire substrate 21 to a thickness of 0.2 $\mu$m, following the contours of the surface. A resist 28 is then deposited to a thickness of 0.5 $\mu$m over the polycrystalline layer 27, and the surface is planarized. The resist 28 is then etched back until the polycrystalline silicon layer 27 overlying the two first gate electrodes 24 is exposed. The resist 28 thus remains only in a depression between the first gate electrodes 24 and in areas outside the two first gate electrodes 24, to the left and right thereof in the drawings.

Figure 1C:
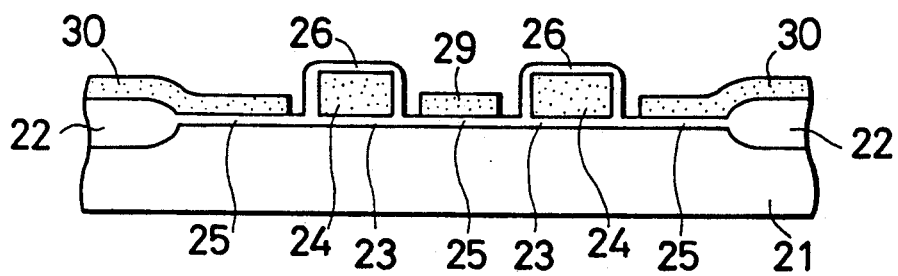

With reference to FIGS. 1B and 1C, the polycrystalline silicon layer 27 is now anisotropically etched, using the remaining resist 28 as a mask. The parts of the polycrystalline silicon layer 27 above and immediately adjacent to the first gate electrodes 24 are thus removed, leaving a polycrystalline silicon second gate electrode 29 between the two first gate electrodes 24, and polycrystalline silicon patterns 30 outside the two first gate electrodes. The remaining resist 28 is then removed, leaving the configuration shown in FIG. 1C.

After completion of the process to the stage illustrated in FIG. 1C, the polycrystalline silicon patterns 30 are removed by photolithographic etching. This photolithographic process requires only rough mask alignment, because the entire area above the first gate electrodes 24 serves as a mask alignment margin.

Figure 1D:
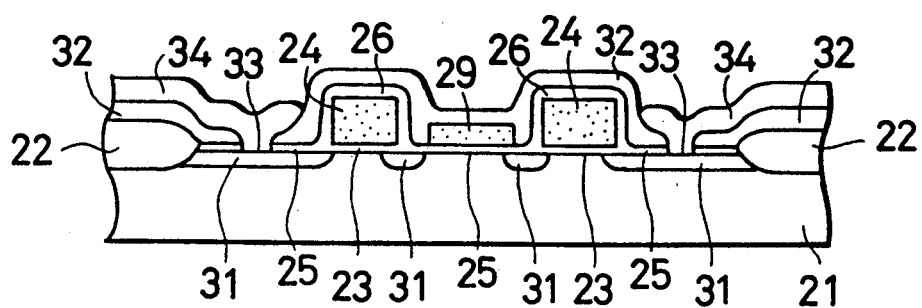

Next, with reference to FIG. 1D, diffusion layers 31 are formed in the substrate 21 by ion implantation of an impurity such as arsenic, using the first gate electrodes 24 and the second gate electrode 29 as a mask. The diffusion layers 31 become sources and drains disposed outside the two first gate electrodes 24 to the left and right, and in the gaps between the first gate electrodes 24 and the second gate electrode 29.

The device is now completed by forming an insulating layer 32 on the entire surface, creating contact openings 33 in the insulating layer 32 and the oxide layer 25 by photolithographic etching, depositing a layer of metal such as aluminum, and patterning the metal by photolithographic etching to form interconnection lines 34. The contact openings 33 are disposed over the diffusion layers 31 outside the first gate electrodes 24, enabling the interconnection lines 34 to make contact with these diffusion layers 31.

In this first novel fabrication process, the second gate electrode 29 is automatically aligned with the first gate electrodes 24 without the need for overlap. Space is accordingly not wasted and the first gate electrodes 24 can be shorter than in the prior art, permitting higher levels of integration to be achieved.

Next the second novel fabrication method will be described.

Figure 2A:
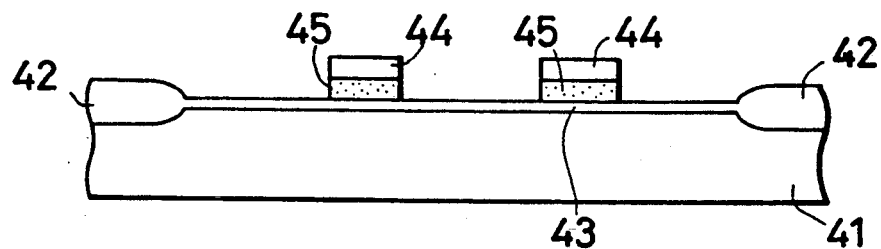
FIGS. 2A to 2D are sectional diagrams illustrating steps in a second novel MOS fabrication process.

With reference to FIG. 2A, a silicon substrate 41 is locally oxidized to form field oxide layers 42, and a first gate oxide layer 43 is formed on the exposed surface of the substrate 41 between the field oxide layers 42. Then polycrystalline silicon including an impurity such as phosphorus is deposited on the entire surface to a thickness of 0.4 μm, and a further oxide layer is deposited over the polycrystalline silicon layer to a thickness of 0.2 μm by the well-known chemical vapor deposition (CVD) method. The oxide layer and polycrystalline silicon are patterned by photolithographic etching to create two separated first gate electrodes 45 each comprising remaining polycrystalline silicon as a conducting layer, each first gate electrode 45 being covered by an insulating layer of oxide 44.

Figure 2B:
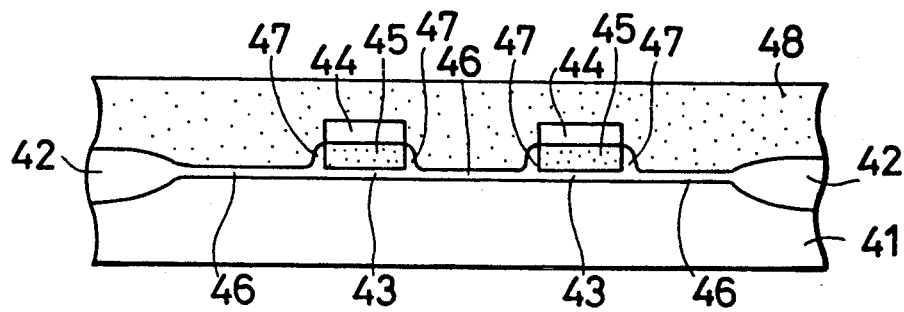

With reference to FIG. 2B, the first gate oxide layer 43 is now removed, except where covered by the first gate electrodes 45, and an oxide layer 46 is formed on the exposed substrate surface by thermal oxidation. That part of the oxide layer 46 disposed between the two first gate electrodes 45 becomes a second gate oxide layer. The side surfaces of the first gate electrodes 45 are simultaneously oxidized, forming oxide sidewalls 47.

A polycrystalline layer 48 including an impurity such as phosphorus is now deposited on the entire surface of the substrate 41 to a thickness of 1.0 μm to 1.5 μm, and the surface is planarized, leaving the configuration shown in FIG. 2B.

Figure 2C:
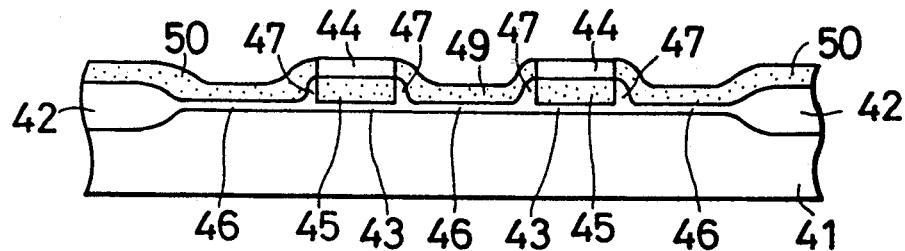

With reference to FIG. 2C, the polycrystalline silicon layer 48 is next etched back until the oxide layer 44 is exposed over the first gate electrodes 45. The remaining part of the polycrystalline silicon layer 48 becomes a second gate electrode 49 disposed between the two first gate electrodes 45, and polycrystalline silicon patterns 50 disposed outside the two first gate electrodes 45. The oxide layers 44 protect the first gate electrodes 45 during this etching process.

The polycrystalline silicon patterns 50 are now removed by photolithographic etching. As in the first novel fabrication process, rough mask alignment suffices in this photolithographic step because the entire area above the first gate electrodes 45 serves as a mask alignment margin.

Figure 2D:
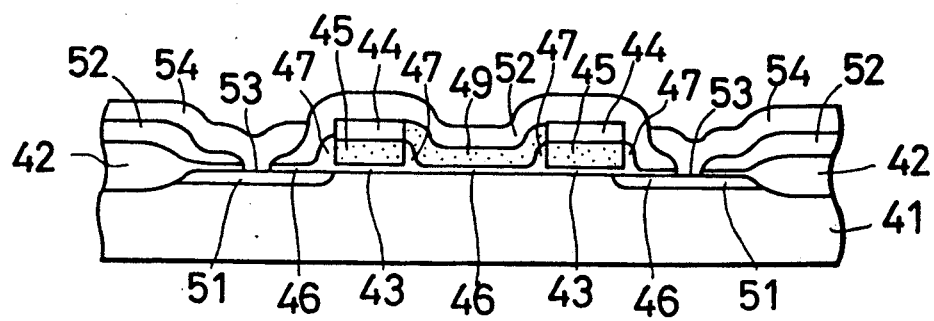

With reference to FIG. 2D, source and drain diffusion layers 51 are now formed in the substrate 41 by ion implantation of an impurity such as arsenic or phosphorus, the first gate electrodes 45 and the second gate electrode 49 acting as a mask. These diffusion layers 51 are disposed outside the first gate electrodes 45, to the right and left in the drawing; no source or drain diffusion layers are formed between the first gate electrodes 45 and the second gate electrode 49.

Finally, the semiconductor device is completed as in the first novel fabrication process by forming an insulating layer 52 on the entire surface, creating contact openings 53 in the insulating layer 52 and the oxide layer 46 over the diffusion layers 51, depositing a layer of a metal, and patterning the metal to form interconnection lines 54 making contact with the diffusion layers 51 through the contact openings 53.

In the resulting device, a single undivided channel extends between the two diffusion layers 51. This channel is crossed by two first gate electrodes 45 and one second gate electrode 49, creating three transistors connected in series.

One possible concern in the second novel fabrication method is current leakage between the first gate electrodes 45 and the second gate electrode 49. This worry can be avoided by depositing a further CVD oxide layer on the entire surface after the step shown in FIG. 2A, then carrying out an anisotropic etch, thereby leaving insulating sidewalls on both the first gate electrodes 45 and the oxide layers 44 in FIG. 2A. The fabrication process can then be completed as illustrated in FIGS. 2B, 2C, and 2D, except that it is not necessary to form the oxide sidewalls 47.

In the second novel fabrication method, as in the first novel method, the second gate electrode 29 is self-aligned with the first gate electrodes 24 without overlap. High levels of integration can accordingly be achieved.

It will be obvious to one skilled in the art that the novel fabrication methods described above can be modified in various ways without departing from the spirit and scope of the invention. For example, the processes illustrated fabricate only two first gate electrodes and one second gate electrode, but a larger number of first and second gate electrodes can obviously be formed, provided that these are disposed in an alternating manner.

What is claimed is:

1. A fabrication method for forming MOS field-effect transistors connected in series on a main surface of a semiconductor substrate, comprising the steps of:
   (a) forming a first gate electrode over a first area on the main surface of said substrate and a second gate electrode over a second area on the main surface of said substrate, said first and second area being mutually separated by a certain distance;
   (b) covering all exposed surfaces with a first insulating layer, said exposed surfaces including said first and second gate electrodes, a third area which is located on the main surface of said substrate and between said first and second areas, and fourth areas which are located on the main surface of said substrate, between said first and third areas and between said second and third areas;
   (c) covering said first insulating layer with a polycrystalline conducting layer;
   (d) covering said polycrystalline conducting layer with a resist;
   (e) etching back said resist until the polycrystalline conducting layer is exposed over said first, second and fourth areas, thus leaving the remaining portion of the resist disposed over said third area;
   (f) etching said polycrystalline conducting layer with the remaining portion of said resist mask as a mask, thereby leaving a third gate electrode disposed over said third area; and
   (g) forming source and drain diffusion layers in said fourth areas on the main surface of said substrate by ion implantation using said first, second and third gate electrodes as masks.

2. The method of claim 1 wherein, after the step (f), portions of said first insulating layer are exposed over said fourth areas.

3. The method of claim 1, wherein said etching in step (f) is performed by an anisotropic etch.

* * * * *